United States Patent [19]
Ma

[11] Patent Number: 4,625,183
[45] Date of Patent: Nov. 25, 1986

[54] LOW-COST VCO USING LUMPED ELEMENTS IN MICROWAVE BAND

[75] Inventor: John Ma, Milpitas, Calif.

[73] Assignee: Capetronic (BSR) Ltd., Kowloon, Hong Kong

[21] Appl. No.: 747,657

[22] Filed: Jun. 21, 1985

[51] Int. Cl.$^4$ ............................................. H03B 5/20
[52] U.S. Cl. ................................................ 331/117 R
[58] Field of Search ............... 331/105, 108 R, 117 R, 331/177 V; 334/15; 455/255, 262; 361/397, 400

[56] References Cited

U.S. PATENT DOCUMENTS

| | | |
|---|---|---|
| 3,940,714 | 2/1976 | Sato ............................. 331/177 V X |
| 4,494,081 | 1/1985 | Lea et al. ..................... 331/177 V X |
| 4,564,822 | 1/1986 | Saitoh et al. ..................... 331/117 R |

Primary Examiner—Eugene R. LaRoche
Assistant Examiner—D. C. Mis
Attorney, Agent, or Firm—Leydig, Voit & Mayer

[57] ABSTRACT

A voltage controlled oscillator (VCO) for a television tuner for tuning a large number of television channels, including signals in the microwave frequency range, the VCO comprising a printed circuit (PC) board having a dielectric substrate, a patterned metal layer on one side of the substrate, and a substantially continuous metal layer forming a ground plane on the other side of the substrate, a transistor mounted on the ground plane side of the PC board, and having emitter, base and collector leads projecting laterally from the transistor, the base of the transistor being connected to the ground plane, a d-c supply circuit connected to the transistor, a tuned circuit connected across the collector and emitter of the transistor, the tuned circuit including at least one ground connection to the ground plane of the PC board, the d-c supply circuit, the tuned circuit, and the transistor having values which produce an oscillating output at a frequency of at least one GHz, and the ground connections being interconnected by a continuous wide area of the ground plane to provide a short-distance, low-loss path for ground currents at the operating frequency of the VCO.

18 Claims, 3 Drawing Figures

LOW-COST VCO USING LUMPED ELEMENTS IN MICROWAVE BAND

BACKGROUND OF THE INVENTION

The present invention relates generally to voltage-controlled oscillators, which are commonly referred to as "VCO's". This invention particularly relates to an improved construction for low-cost VCO's fabricated from discrete components on a printed circuit board and suitable for use in the microwave frequency band, e.g., one GHz and higher.

VCO's are used in a variety of electronic communication devices such as FM detectors, radio and television tuners, and the like. VCO's have typically operated in the MHz frequency range, but with the increasing number of television channels, operating at frequencies of up to 900 MHz and above, it has become increasingly desirable to have VCO's that operate at higher frequency levels, including the microwave frequency range. Such oscillators are readily available if cost is no object, but the challenge is to provide such an oscillator at a cost low enough to make it economically feasible for use in such highly cost-competitive markets as consumer electronics. These markets require not only low cost, but also highly reliable performance over a long operating life.

It is, therefore, a primary object of the present invention to provide a high-frequency (e.g., one to two GHz) VCO which can be mass produced at a low cost while at the same time providing highly reliable operation and a long operating life.

It is another important object of this invention to provide such a high-frequency VCO which can be fabricated on a printed circuit board using a small number of components in a small space.

A further object of the invention is to provide such an improved VCO which can be easily tuned both during production and during operation.

Other objects and advantages will be apparent from the following detailed description in the accompanying drawings.

DESCRIPTION OF THE PREFERRED EMBODIMENTS

Figure 1:
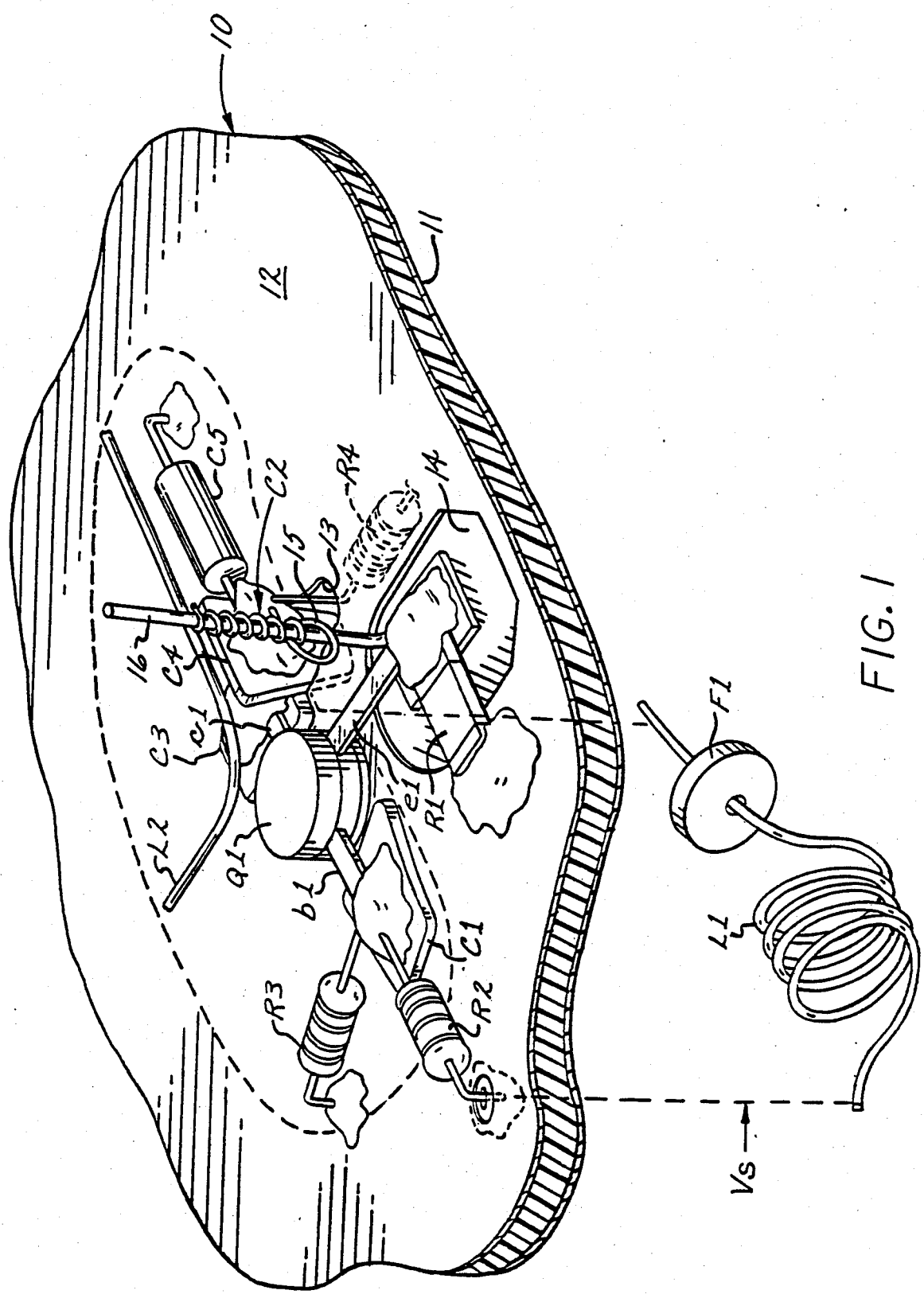
FIG. 1 is a perspective view of the ground plane side of a printed circuit board on which an exemplary embodiment of the VCO of the present invention is fabricated.

While the invention will be described in connection with certain preferred embodiments, it will be understood that it is not intended to limit the invention to those particular embodiments. On the contrary, it is intended to cover all alternatives, modifications and equivalent arrangements as may be included within the spirit and scope of the invention as defined by the appended claims.

Turning now to the drawings and referring first to FIGS. 1 and 2, there is shown an exemplary physical embodiment of a VCO fabricated on a printed circuit board 10 (referred to hereinafter as the "PC board").

The PC board 10 is of conventional construction, comprising a dieletric substrate with conductive metal layers 11 and 12 on opposite sides thereof. The conductive metal layer 11 on one side of the board forms a predetermined pattern of conductors for interconnecting various discrete circuit components mounted on the board, while the conductive metal layer 12 on the other side of the board forms a continuous ground plane. Normally the circuit components are mounted on the patterned side of the board with various leads passing through the substrate to the ground plane 12 to form the necessary ground points in the circuit. In the exemplary VCO, however, it will be noted that most of the circuit components are mounted on the ground plane side of the board. As will be described in more detail below, this is particularly advantageous for the oscillator of the present invention which is intended to operate at frequencies in the microwave range. It will also be noted that the discrete circuit components are located very close to each other, thereby providing short lead lengths that avoid unwanted inductances which are so easily produced at high operating frequencies, particularly in the microwave range.

Figure 3:
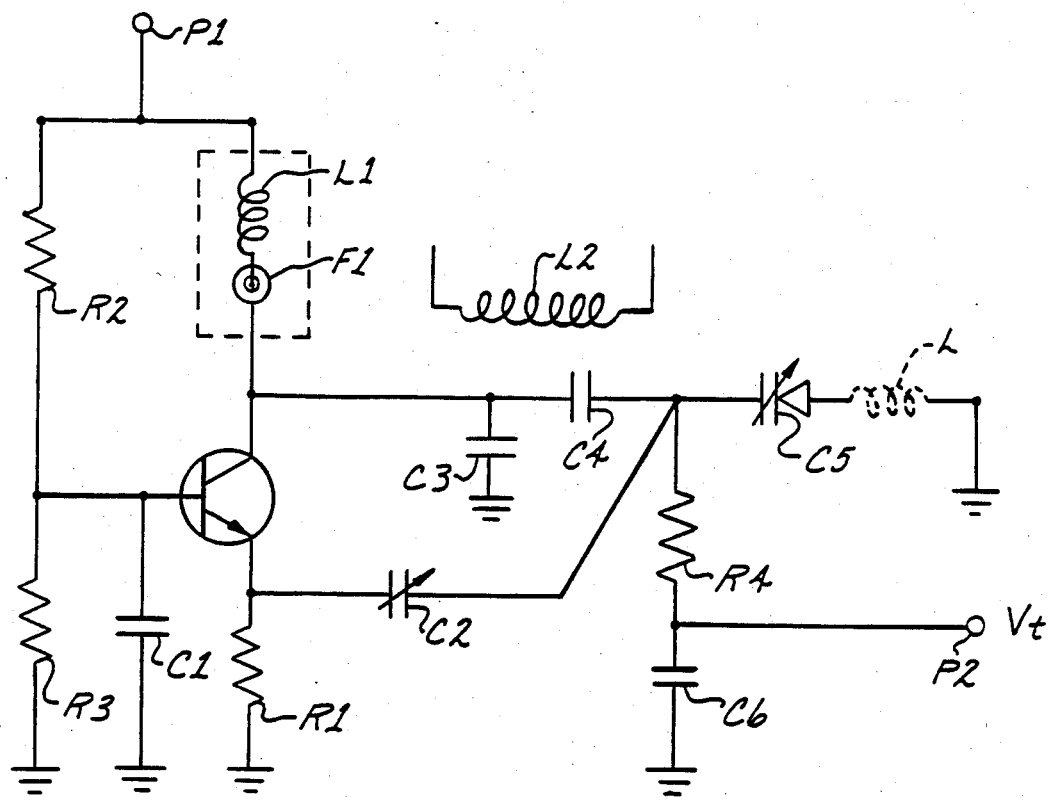
FIG. 3 is a schematic circuit diagram of the VCO shown in FIGS. 1 and 2.

A schematic circuit diagram of the illustrative VCO is shown in FIG. 3. In this circuit, a transistor Q1 has its base grounded through a capacitor C1. The collector and emitter of the transistor Q1 are connected to a tuned LC circuit. The capacitance of the tuned circuit is provided by a group of capacitors C2, C3, C4 and C5, while the inductance is provided by the short leads of these capacitors, particularly the lead connecting the capacitor C5 to ground (a broken-line inductor L has been shown in this location in FIG. 3). The capacitor C2 is connected across the emitter and collector of transistor Q1, as well as the capacitors C3 and C4; the capacitor C3 is connected from the collector of transistor Q1 to ground; and the capacitors C4 and C5 are connected in series with each other, from the collector of transistor Q1 to ground.

A d-c voltage source $V_s$ connected to a terminal P1 supplies current to the collector-emitter circuit through an RF choke formed by an inductor L1 and a ferrite core F1. The collector-emitter circuit also includes a resistor R1 connected between the emitter and ground. The d-c voltage source $V_s$ also applies a biasing voltage to the base of the transistor via a voltage divider formed by a pair of resistors R2 and R3 connected in series between the voltage source $V_s$ and ground.

To permit the oscillator to be electronically tuned to produce different output frequencies, the capacitor C5 is a varactor, and an adjustable d-c tuning voltage $V_t$ is applied to the varactor from an input terminal P2 connected to the varactor via resistor R4 and to ground via capacitor C6. As is well known, the capacitance of a varactor can be varied by adjusting the voltage across the varactor, and this characteristic of varactors is commonly used for tuning purposes in electronic tuners.

The output of the oscillator is picked up by an inductive pick-up loop or coil L2 located adjacent the tuned circuit.

Returning now to FIGS. 1 and 2, the physical construction of the oscillator circuit described above will be described using the same reference characters used in FIG. 3. A transistor Q1 is physically mounted on the ground-plane side of the PC board 10 with the three transistor leads b1, e1 and c1 extending laterally from the transistor so that the leads are spaced above the ground plane 12. The base lead b1 from the transistor is soldered to a chip-type capacitor C1 which is contiguous to the transistor Q1 and rests directly on, and is electrically connected to, the outer surface of the ground plane 12. The top surface of this capacitor C1 is not only connected to the base lead of the transistor, but also is used as a substrate for a soldered connection of the base lead and the capacitor C1 to a pair of resistors R2 and R3; the resistor R3 is connected to the ground plane 12, while the resistor R2 leads to the voltage source $V_s$ on the patterned side 12 of the PC board, thereby forming the voltage divider described above.

The collector lead c1 of the transistor is also soldered to the top surface of a chip-type capacitor C3 which is contiguous to the transistor Q1 and rests on, and is electrically connected to, the outer surface of the ground plane 12. The top surface of this capacitor C3 is also soldered to a contiguous third chip-type capacitor C4 which is mounted perpendicular to the PC board, extending through a cutout 13 in the PC board so that the capacitor C4 is accessible on both sides of the board. One side of the capacitor C4 is spaced away from the edges of the cutout 13 and is soldered to (1) a varactor C5 which has its other end soldered to the ground plane 12, and (2) a gimmick capacitor C2 which is connected at its other end to the emitter lead e1 of the transistor.

The emitter lead e1 of the transistor extends over a small etched area 14 on the adjacent surface of the PC board, i.e., the metal of the ground plane side of the PC board has been removed from this small area 14 for d-c isolation. The central region of the etched area 14 is used as a substrate for a solder connection between the emitter lead e1, the gimmick capacitor C2 and the resistor R1. In the illustrative embodiment the resistor R1 is a chip-type resistor which has one end soldered to the emitter lead of the transistor and its other end soldered to the ground plane.

Figure 2:
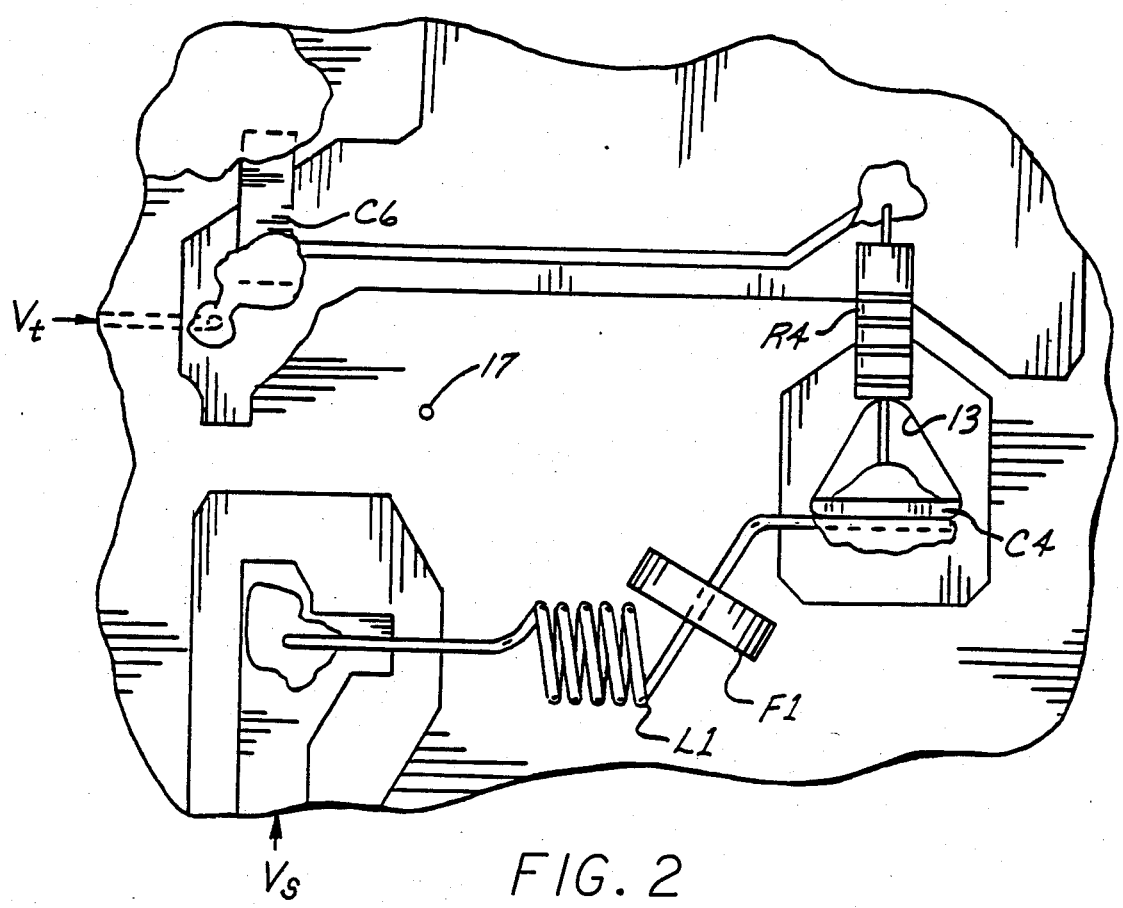
FIG. 2 is a plan view of the opposite side, i.e., the patterned side, of the printed circuit board shown in FIG. 1.

As will be appreciated from the foregoing description and FIGS. 1 and 2, the capacitors C1, C3 and C5 are all connected directly to the ground plane 12, and all these ground plane connections are interconnected by a continuous wide area of the ground plane metal. This uninterrupted region of the ground plane which interconnects the various ground points in the oscillator circuit is generally indicated by the broken line in FIG. 1. It will be noted that this region of the ground plane does not include the region between the collector and emitter leads, where the ground plane is interrupted by the cutout 13 and the etched area 14.

It has been found that the use of the ground plane of a PC board, and particularly the outer surface of the ground plane, as a common mounting and grounding surface is especially useful for a microwave-frequency VCO. At these high frequencies, the ground currents are carried very near the surface of the metal layer which forms the ground plane. In low-cost PC boards, the inner surface of the metal layer 12 is wavy or irregular; this provides good bonding of the ground-plane metal to the dielectric substrate of the PC board, but it provides an undesirably long path length for currents carried near that surface. The outer surface of the metal layer 12, however, is smooth, thereby providing a short path length and correspondingly low losses for currents carried near the outer surface. This short path length and the continuous wide conductive surface provided by the ground plane have been found to permit the fabrication of a low-cost VCO which is capable of operating efficiently and reliably in the microwave frequency range. Specifically, the illustrative VCO reliably produces an output at 1.5 to 2.0 GHz. At these high frequencies, power losses become critical to the production of an oscillatory output from a low-cost circuit using a conventional transistor and tuned circuit, and the ground-plane mounting of the circuit significantly reduces the power losses.

As can be seen in FIG. 2, the RF choke formed by the inductor L1 and the ferrite core F1 is mounted on the patterned side 11 of the PC board 10 to avoid inductive interference with the tuned circuit. One end of this choke is connected to the d-c supply voltage source $V_s$, while the other end is soldered to the same side of the capacitor C4 that is connected to the capacitor C3.

The gimmick capacitor C2, which comprises a pair of twisted insulated wires 15 and 16, facilitates the tuning of the oscillator during mass production. As is well known in the art, the capacitance of a gimmick capacitor can be easily varied by merely adjusting the spacing of the two twisted wires to effect fine adjustments in the capacitance of a tuned circuit.

The tuning voltage input circuit, which comprises a chip-type capacitor C6 connected between the source of input voltage $V_t$ and ground, and a resistor R4 connected between the input voltage $V_t$ and the two capacitors C4 and C5, is also mounted on the patterned side 11 of the PC board, for convenience. The connection between the resistor R4 and the capacitor C4 is effected by a solder joint on the surface of the capacitor C4, and this same surface of the capacitor C4 is used to solder the resistor R4 to both the gimmick capacitor C2 and the varactor C5. As can be seen in both FIGS. 1 and 2, the edge of the cutout 13 in the PC board is spaced away from these soldered connections on the surface of the capacitor C4, to avoid parasitic effects from the PC board on the tuned circuit. The grounded end of the capacitor C6 is connected via the patterned metal layer 11 to a lead 17 which passes through the PC board to the grounded plane 12.

The output of the oscillator circuit is picked up by an inductive pickup coil L2 which is positioned adjacent the capacitors C3, C4 and C5. With the illustrative VCO, it has been found that the oscillating output signal induced in the pickup coil L2 can be reliably reproduced in mass production, and can be precisely tuned to different frequencies by changing the d-c level of the adjustable tuning voltage $V_t$. During production, the oscillator circuit can be fine tuned by adjustment of the gimmick capacitor C2.

Although the illustrative VCO can be made with different combinations of values for the various components, the preferred embodiment of the illustrative circuit uses the following values to produce a 1.5 to 2.0 GHz output:

$V_s$: +18 v.
$V_T$: 2–20 v.
Q1: NEO2137
L1: 4T ⅛" O.D. #24 wire
C1: 470 pf
C2: 0.2–0.5 pf
C3: 3.9 pf
C4: 39 pf
C5: BB 221 varicap
C6: 470 pf
R1: 220
R2: 2.2K
R3: 2.2K
R4: 2.2K As can be seen from the foregoing detailed description, the present invention provides a microwave-frequency VCO which can be mass produced at a low cost while at the same time providing highly reliable operation at a long operating life. This VCO can be fabricated on a low-cost printed circuit board using a small number of components in a small space. The VCO can be easily tuned both during production and during operation.

Furthermore, the same PC board can be used for other lower frequency circuits such as a 600-MHz if amplifier 1 and a 0.95 to 1.45 RF amplifier and mixer.

I claim:

1. A voltage controlled oscillator (VCO) for a television toner for tuning a large number of television channels, including signals in the microwave frequency range, said VCO comprising
 a printed circuit (PC) board having a dielectric substrate, a patterned metal layer on one side of the substrate, and a substantially continuous metal layer forming a ground plane on the other side of the substrate,
 a transistor mounted on the ground plane side of said PC board, and having emitter, base and collector leads projecting laterally from the transistor, the base of said transistor being connected to said ground plane,
 a d-c supply circuit connected to said transistor,
 a tuned circuit connected across the collector and emitter of said transistor, said tuned circuit including at least one ground connection to the ground plane of said PC board,
 said d-c supply circuit, said tuned circuit, and said transistor having values which produce an oscillating output at a frequency of at least one GHz, and
 said ground connections being interconnected by a continuous wide area of said ground plane to provide a short-distance, low-loss path for ground currents at the operating frequency of said VCO.

2. A VCO as set forth in claim 1 wherein said metal layer forming said ground plane has an inner surface bonded to said dielectric substrate and an outer surface facing away from said substrate, and said ground connections to said ground plane are made to the outer surface of the metal layer forming said ground plane.

3. A VCO as set forth in claim 1 wherein said d-c supply circuit includes an RF choke comprising an inductor which is mounted on said patterned side of said PC board.

4. A VCO as set forth in claim 1 wherein said tuned circuit includes a varactor having one side connected to said ground plane.

5. A VCO as set forth in claim 1 which includes a coupling coil for picking up said oscillating output.

6. A VCO as set forth in claim: 1 wherein said tuned circuit includes a gimmick capacitor connected to the emitter of said transistor.

7. A VCO as set forth in claim 1 which includes a tuning voltage input circuit connected to said tuned circuit and mounted on the patterned side of said PC board, said PC board being cut out around said tuning voltage input circuit connection, which passes through said board between said input circuit and said tuned circuit, to avoid parasitic effects from said printed circuit board.

8. A VCO as set forth in claim 1 wherein said ground plane of said PC board has a small etched area adjacent the emitter lead of said transistor, and the connections to said emitter lead are made within said small etched area, on the dielectric substrate of said board.

9. A VCO as set forth in claim 1 wherein the base lead of said transistor is connected to a chip-type capacitor mounted on and electrically connected to said ground plane and located between said base lead and said ground plane, and at least one component of said d-c supply circuit is connected to said base lead on the surface of said capacitor facing away from said ground plane.

10. A VCO as set forth in claim 1 wherein the collector lead of said transistor is connected to a chip-type capacitor mounted on and electrically connected to said ground plane and located between said collector lead and said ground plane, and at least one component of said tuned circuit is connected to said collector lead on the surface of said capacitor facing away from said ground plane.

11. A VCO as set forth in claim 1 which includes circuit components on both sides of said printed circuit board, and said board has an aperture therethrough with a chip-type capacitor extending through the aperture with at least one circuit component on each side of said board being connected to said capacitor, the edge of said aperture in said printed circuit board being spaced away from at least one side of said capacitor to avoid parasitic effects from said PC board.

12. A VCO as set forth in claim 1 wherein said metal layer forming said ground plane has an inner surface bonded to said dielectric substrate and an outer surface facing away from said substrate, and said tuned circuit comprises at least one chip-type capacitor mounted on and electrically connected to the outer surface of the metal layer forming said ground plane, varactor having one end electrically connected to the outer surface of the metal layer forming said ground plane, and a gimmick capacitor having one end connected to the emitter of said transistor.

13. A VCO as set forth in claim 1 wherein the base of said transistor is connected to said ground plane via a capacitor.

14. A VCO as set forth in claim 1 wherein said tuned circuit includes a varactor, and means for applying a controllably variable d-c tuning voltage to said varactor to adjust the frequency of said oscillating output.

15. A voltage controlled oscillator (VCO) for a television tuner for tuning a large number of television channels, including signals in the microwave frequency range, said VCO comprising
 a printed circuit (PC) board having a dielectric substrate, a patterned metal layer on one side of the substrate, and a substantially continuous metal layer forming a ground plane on the other side of the substrate, said ground plane having a wavy inner surface bonded to said substrate and a smooth outer surface opposite to said inner surface,
 a transistor mounted on the ground plane side of said PC board, and having emitter, base and collector leads projecting laterally from the transistor, the base of said transistor being connected to the outer surface of the metal layer forming said ground plane,
 a d-c supply circuit connected to said transistor,
 a tuned circuit connected across the collector and emitter of said transistor, said tuned circuit including at least one ground connection to the outer surface of the metal layer forming said ground plane, said d-c supply circuit, said tuned circuit, and said transistor having values which produce an oscillating output at a frequency of at least one GHz.

16. A voltage controlled oscillator (VCO) for a television tuner for tuning a large number of television channels, including signals in the microwave frequency range, said VCO comprising a printed circuit (PC) board having a dielectric substrate, a patterned metal layer on one side of the substrate, and a substantially continuous metal layer forming a ground plane on the-other side of the substrate, a transistor mounted on the ground plane side of said PC board, and having emitter, base and collector leads projecting laterally from the transistor, a d-c supply circuit connected to said transistor, a tuned circuit connected across the collector and emitter of said transistor, said tuned circuit including at least one ground connection to the ground plane of said PC board, said d-c supply circuit, said tuned circuit, and said transistor having values which produce an oscillating output at a frequency of at least one GHz, and certain of the components of said tuned circuit and d-c supply circuit being mounted on the patterned side of said printed circuit board, said board having an aperture therethrough with a chip-type capacitor extending through the aperture with at least one circuit component on each side of said board being connected to said capacitor, the edge of said aperture in said printed circuit board being spaced away from at least one side of said capacitor to avoid parasitic effects from said PC board.

17. A voltage controlled oscillator (VCO) for a television tuner for tuning a large number of television channels, including signals in the microwave frequency range, said VCO comprising a printed circuit (PC) board having a dielectric substrate, a patterned metal layer on one side of the substrate, and a substantially continuous metal layer forming a ground plane on the other side of the substrate, a transistor mounted on the ground plane side of said PC board, and having emitter, base and collector leads projecting laterally from the transistor, a d-c supply circuit connected to said transistor, a tuned circuit connected across the collector and emitter of said transistor, said tuned circuit including at least one ground connection to the ground plane of said PC board, said d-c supply circuit, said tuned circuit, and said transistor having values which produce an oscillating output at a frequency of at least one GHz, and a tuning voltage input circuit connected to said tuned circuit and mounted on the patterned side of said PC board, said PC board being cut out around said tuning voltage input circuit connection, which passes through said board between said input circuit and said tuned circuit, to avoid parasitic effects from said printed circuit board.

18. A voltage controlled oscillator (VCO) for a television tuner for tuning a large number of television channels, including signals in the microwave frequency range, said VCO comprising a printed circuit (PC) board having a dielectric substrate, a patterned metal layer on one side of the substrate, and a substantially continuous metal layer forming a ground plane on the other side of the substrate, said continuous metal layer having an inner surface bonded to said dielectric substrate and an outer surface facing away from said substrate, a transistor mounted on the ground plane side of said PC board, and having emitter, base and collector leads projecting laterally from the transistor, the base of said transistor being connected to said ground plane, a d-c supply circuit connected to said transistor, a tuned circuit connected across the collector and emitter of said transistor, said tuner circuit including at least one chip-type capacitor mounted on and electrically connected to the outer surface of the metal layer forming said ground plane, a varactor having one end electrically connected to the outer surface of the metal layer forming said ground plane, and a gimmick capacitor having one end connected to the emitter of said transitor, said d-c supply circuit, said tuned circuit, and said transistor having values which produce an oscillating output at a frequency of at-least one GHz.

* * * * *